United States Patent [19]
Mochuzuki et al.

[11] Patent Number: 5,003,213
[45] Date of Patent: Mar. 26, 1991

[54] SURFACE ACOUSTIC WAVE CONVOLVER WITH PLURAL WAVE GUIDE PATHS FOR GENERATING CONVOLUTION SIGNALS OF MUTUALLY DIFFERENT PHASES

[75] Inventors: Norihiro Mochuzuki, Yokohama; Koichi Egara, Tokyo; Kenji Nakamura, Hadano, all of Japan

[73] Assignee: Canon Kabushiki Kaisha, Tokyo, Japan

[21] Appl. No.: 440,853

[22] Filed: Nov. 24, 1989

[30] Foreign Application Priority Data

Dec. 15, 1988 [JP] Japan ........................ 63-315161
Feb. 20, 1989 [JP] Japan ........................ 1-030394

[51] Int. Cl.[5] ........................ H01L 41/08
[52] U.S. Cl. ........................ 310/313 D; 333/154; 364/821
[58] Field of Search ........... 310/313 R, 313 D, 313 B; 333/153, 154, 195; 364/821

[56] References Cited

U.S. PATENT DOCUMENTS 4,028,649 6/1977 Komatso et al. .............. 333/194
4,114,116 9/1978 Reeder .............. 364/821 X
4,556,949 12/1985 Solie .............. 310/313 R X
4,675,839 6/1987 Kerr .............. 364/821
4,764,701 8/1988 Garbacz et al. .............. 310/313 R
4,841,470 6/1989 Okamoto et al. .............. 333/193 X
4,882,715 11/1989 Egara et al. .............. 367/140

FOREIGN PATENT DOCUMENTS 1-180110 7/1989 Japan .

*Primary Examiner*—Mark O. Budd
*Attorney, Agent, or Firm*—Fitzpatrick, Cella, Harper & Scinto

[57] ABSTRACT

A surface acoustic wave convolver comprises a piezoelectric substrate, a plurality of input transducers formed on the substrate and adapted to respectively generate surface acoustic waves in response to input signals, and a plurality of wave guide paths parallelly provided on the substrate in a superposing area of the surface acoustic wave generated by the input transducers to each generate a convolution signal of the input signals by non-linear interaction of the surface acoustic waves therein. The convolution signals generated in neighboring wave guide paths are mutually different by 180° in phase, and the wave guide paths are adapted to generate surface acoustic waves corresponding to the convolution signals and an output transducer receives the surface acoustic waves generated by the wave guide paths and converts the convolution signals into an output electrical signal.

12 Claims, 8 Drawing Sheets

SURFACE ACOUSTIC WAVE CONVOLVER WITH PLURAL WAVE GUIDE PATHS FOR GENERATING CONVOLUTION SIGNALS OF MUTUALLY DIFFERENT PHASES

BACKGROUND OF THE INVENTION

1. Field of the Invention

The present invention relates to a surface acoustic wave convolver for obtaining convolution outputs utilizing non-linear interaction of plural surface acoustic waves.

2. Related Background Art

The surface acoustic wave convolvers are increasing their importance in recent years as a key device in the spread spectrum communication. Also they are actively developed for various applications as real-time signal processing devices.

FIG. 1 is a schematic plan view showing an example of such a conventional surface acoustic wave convolver.

On a piezoelectric substrate 1, there are provided a pair of comb electrodes 2 and a central electrode 3. The comb electrodes 2 are used for generating surface acoustic wave signals, and the central electrode 3 serves to cause propagation of said signals in mutually opposite directions and to obtain an output signal.

When one of said comb electrode 2 is given a signal $F(t)\exp(j\omega t)$ while the other is given a signal $G(t)\exp(j\omega t)$, two surface acoustic waves:

$$F(t-x/v)\exp[j\omega(t-x/v)] \quad (1a)$$

$$G(t-(L-x)/v)\exp[j\omega(t-(L-x)/v)] \quad (1b)$$

propagate in mutually opposite directions along the surface of the piezoelectric substrate 1, wherein v is the velocity of said surface acoustic wave, and L is the length of the central electrode 3.

On the path of said propagation, a component of product of said surface acoustic waves is generated by the non-linear effect, and is integrated over the central electrode 3 as the output signal. Said output signal H(t) can be represented by:

$$H(t) = \alpha \cdot \exp(j2\omega t) \int_0^L F(t - x/v)G(t - (L - x)/v)dx \quad (2)$$

wherein α is a proportional coefficient.

Thus a convolution signal of two signals F(t) and G(t) can be obtained from the central electrode 3.

However, since such structure is unable to provide sufficient efficiency, there is proposed a surface acoustic wave convolver of the structure shown in FIG. 2 (Nakagawa et al., Journal of Electronic Communication Association '86/2, Vol. J69-c, No. 2, pp 190–198).

On a piezoelectric substrate 1 there are provided a pair of input comb electrodes 2 and an output comb electrode 4. Also on said substrate there are provided waveguides 3-1–3-N between said input comb electrodes 2.

When one of said comb electrodes 2 is given a signal $F(t)\exp(j\omega t)$ while the other is given a signal $G(t)\exp(j\omega t)$, the generated surface acoustic waves propagate in mutually opposite directions along the waveguides 3-1–3-N, thereby generating a convolution signal represented by the equation (2) on each propagation path, due to the non-linear effect of the piezoelectric substrate 1.

These signals generate, in a direction perpendicular to the wave guide paths 3-1–3-N, a surface acoustic wave which is converted by the output comb electrode 4 into an electric convolution signal.

However, in such conventional structure, the surface acoustic wave generated by a comb electrode 2 and transmitted through the wave guide paths 3-1–3-N is reflected upon reaching the other comb electrode 2 and overlaps with the surface acoustic wave propagating in the normal direction to cause so-called self convolution. Consequently the conventional surface acoustic wave convolvers are associated with a drawback that the unnecessary signal resulting from self convolution overlaps the desired convolution signal.

In addition the conventional structures cannot be satisfactory in terms of the efficiency.

SUMMARY OF THE INVENTION

The object of the present invention is to provide a surface acoustic wave convolver which is free from the above-mentioned drawbacks in the prior technology, is capable of suppressing the self convolution and obtaining the convolution signal efficiently.

The above-mentioned object can be attained according to the present invention, by a surface acoustic wave convolver comprising:

a piezoelectric substrate;

plural input transducers formed on said substrate and adapted to respectively generate surface acoustic waves in response to an input signal;

plural waveguides provided parallelly in a superposing area of the surface acoustic waves generated by said input transducers on the substrate and adapted to respectively generate a convolution signal of said input signals by non-linear interaction of the surface acoustic waves, wherein said convolution signals generated in neighboring waveguides are mutually different in their phases by 180° and wherein said waveguides are adapted to generate surface acoustic waves corresponding to said convolution signal; and an output transducer for receiving the surface acoustic waves generated by said waveguides to convert said convolution signal into an electric signal.

DESCRIPTION OF THE PREFERRED EMBODIMENTS

Figure 1:
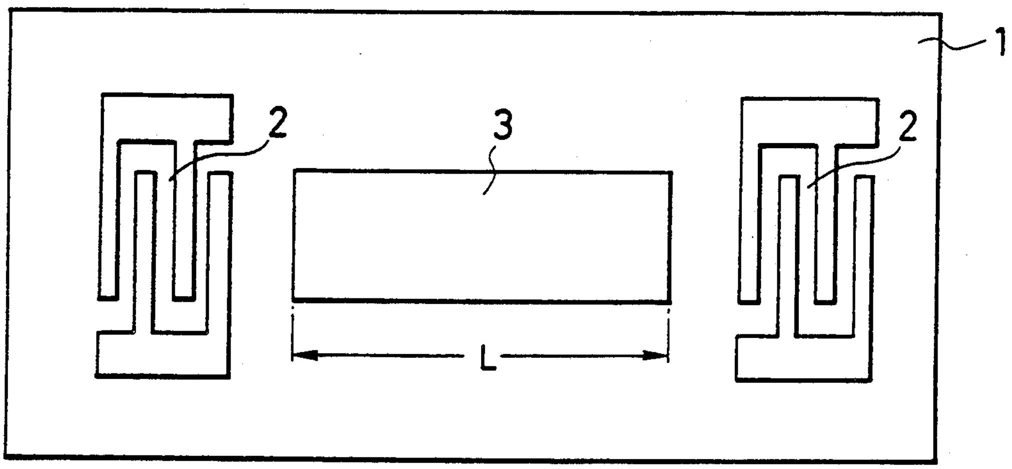
FIG. 1 (PRIOR ART)
FIGS. 1 and 2 are schematic plan views showing examples of conventional surface acoustic wave convolver.
Figure 2:
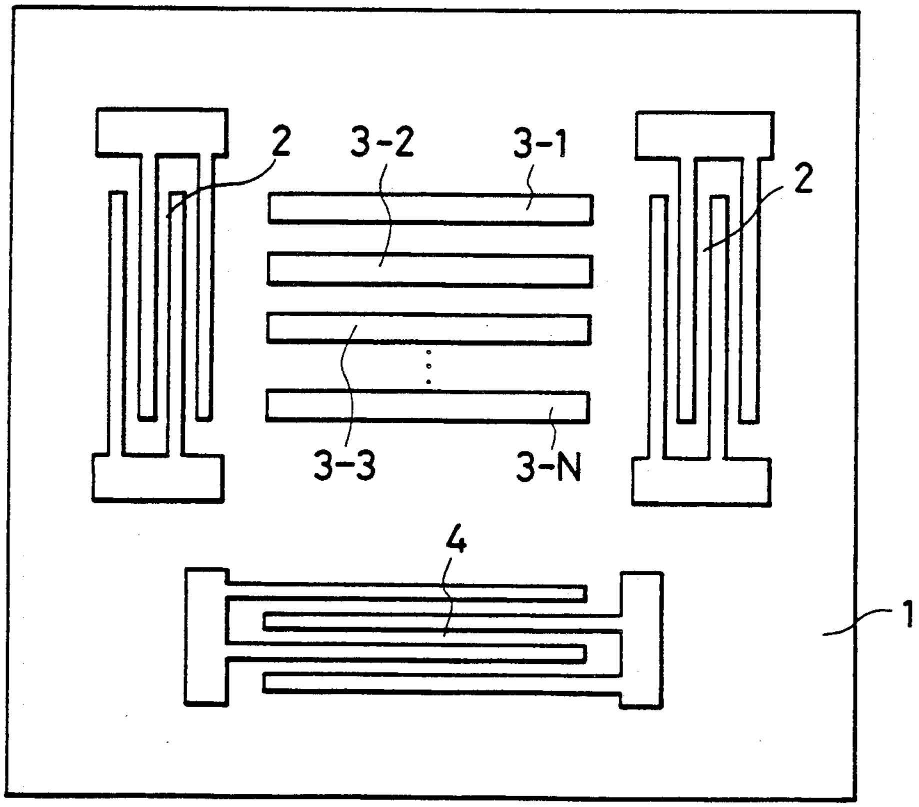
FIG. 2 (PRIOR ART)
Figure 3:
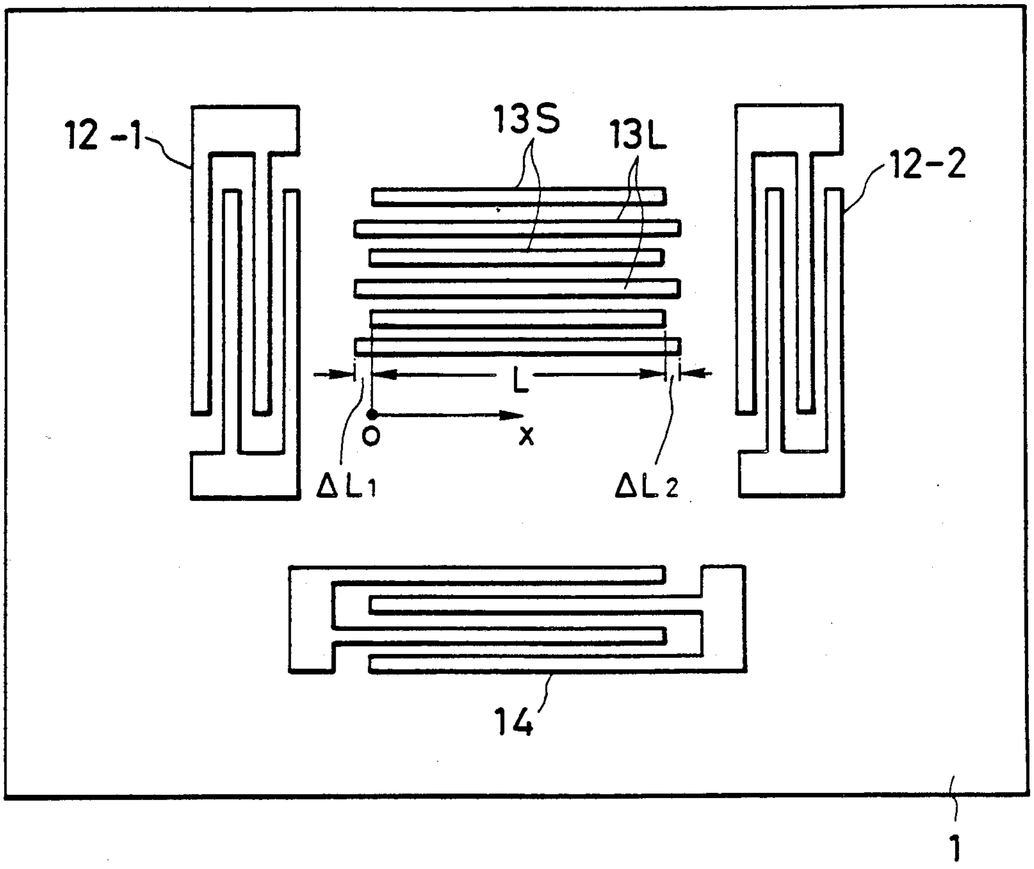
FIG. 3 is a schematic plan view of a first embodiment of the surface acoustic wave convolver of the present invention.

FIG. 3 is a schematic plan view of a first embodiment of the surface acoustic wave convolver of the present invention.

On a piezoelectric substrate 1, there are provided a pair of input comb-shaped electrodes (excitation electrodes) 12-1, 12-2, and an output comb-shaped electrode 14. Also on said piezoelectric substrate 1, waveguides 13S, 13L of two different lengths are alternately arranged in parallel manner between said input comb-shaped electrodes 12-1 and 12-2, parallel to the propagating direction of the surface acoustic waves to be excited by said electrodes.

The piezoelectric substrate can be composed of a piezoelectric material such as lithium niobate ($LiNbO_3$), and the input comb-shaped electrodes 12-1, 12-2, waveguides 13S, 13L and output comb-shaped electrode 14 can be formed by depositing conductor films such as of aluminum, gold or silver by an ordinary photolithographic process.

When the surface of the piezoelectric substrate 1 is covered with a conductor, the propagating velocity of the surface acoustic wave becomes lower than that on a free surface, due to the electric field shortcircuiting effect and the mass loading effect. This phenomenon allows to displace the phase, by 180°, of the surface acoustic waves which have passed the neighboring waveguide, by suitably selecting the difference in length of the waveguides 13S and 13L.

In the present embodiment, the left end of the wave guide path 13L is positioned, by $\Delta L_1$, to the left of the left end of the wave guide path 13S, and the right end of the wave guide path 13L is positioned, by $\Delta L_2$, to right of the right end of the wave guide path 13S. The difference $\Delta L$ in length between these two wave guide paths 13S, 13L is so selected as to satisfy the following relation:

$$\Delta L(1/v_m - 1/v_0) = (n + \tfrac{1}{2})/f \quad (3)$$

wherein $v_m$ is the velocity of surface acoustic wave in the waveguides; $v_0$ is the velocity of surface acoustic wave on the free surface of the substrate 1, f is the central frequency of the input signal, and n is an integer.

Thus the surface acoustic wave excited by an input comb-shaped electrode 12-1 reaches the other input electrode 12-2 through the wave guide paths 13S, 13L, and, the phases of the surface acoustic waves transmitted in the wave guide paths 13S and 13L are progressively deviated and show a mutual difference of 180° upon arrival at the other input electrode 12-2. Consequently said waves are electrically neutralized by the electrode fingers constituting the other input comb-shaped electrode 12-2, so that reflected wave by re-excitation is not generated. Similarly the surface acoustic waves generated by the input comb-shaped electrode 12-2 and transmitted by the wave guide paths are mutually deviated in their phases by 180° and are electrically neutralized by the electrode fingers constituting the input comb-shaped electrode 12-1, so that the reflected wave by reexcitation is not generated.

Such absence of the reflected wave from the input comb-shaped electrodes 12-1, 12-2 allows to suppress the self convolution that has been a problem in the conventional convolvers, thus improving the performance of convolvers.

In the present embodiment, the difference $\Delta L$ in the length of two wave guide paths 13S, 13L is so selected as to satisfy the above-mentioned equation (3), but the self-convolution can be suppressed to a certain extent even if said equation is not completely but approximately satisfied.

In the following there will be explained the convolution operation in the present embodiment.

In FIG. 3, x-axis is taken toward right direction with $x=0$ at the left-hand end of the waveguide 13S.

In FIG. 3, two surface acoustic waves propagating in mutually opposite directions in the wave guide path 13S are represented by:

$$F(t - x/v_m)\exp[j\omega(t - x/v_m)] \quad (4a)$$

$$G(t - (L - x)/v_m)\exp[j\omega(t - (L - x)/v_m)] \quad (4b)$$

wherein $0 \leqq x \leqq L$.

On the other hand, two surface acoustic waves propagating in mutually opposite directions in the waveguide 13L are represented by:

$$F(t - x/v_m - \Delta t_1)\exp[j\omega(t - x/v_m - \Delta t_1)] \quad (5a)$$

and $$G(t - (L - x)/v_m - \Delta t_2)\exp[j\omega(t - (L - x)/v_m - \Delta t_2)] \quad (5b)$$

wherein:

$$-L_1 \leqq x \leqq L + L_2$$
$$\Delta t_1 = \Delta L_1(1/v_m - 1/v_0)$$
$$\Delta t_2 = \Delta L_2(1/v_m - 1/v_0)$$
$$\Delta L = \Delta L_1 + \Delta L_2$$

In each of the waveguides 13S, 13L, two surface acoustic waves propagating in mutually opposite directions are superimposed to generate, by non-linear effect, following convolution signals $H_S(t)$ and $H_L(t)$:

$$H_S(t) = \alpha \cdot \exp(j2\omega t) \int_0^L F(t - x/v_m)G(t - (L - x)/v_m)dx$$

and $$H_L(t) = \alpha \cdot \exp\left[j(2\omega t - \Delta t_1 - \Delta t_2)\right] \int_{-L_1}^{L + L_2} F(t - x/v_m - \Delta t_1) \cdot G(t - (L - x)/v_m - \Delta t_2)dx$$

where $\alpha$ is proportion coefficient.

From the foregoing equations (3) and (5): $\Delta t_1 + \Delta t_2 = (n + \tfrac{1}{2})/f = (n + \tfrac{1}{2}) \cdot 2\pi/\lambda$ and, since the changes of F(t) and G(t) for $\Delta t_1$ and $\Delta t_2$ are sufficiently small:

$$F(t - \Delta t_1) \simeq F(t)$$
$$G(t - \Delta t_2) \simeq G(t)$$

Consequently $H_L(t)$ can be represented as:

$$H_L(t) \simeq \alpha \cdot \exp[j(2\omega t - \pi)] \int_{-L_1}^{L + L_2} F(t - x/v_m)G(t - (L - x)/v_m)dx$$

Also since $L_1, L_2 << L$, $$H_L(t) \simeq -H_S(t).$$

Thus the neighboring waveguides generate convolution signals different by 180° in phase.

Consequently plural sets of two different wave guide paths 13S, 13L function like a comb-shaped electrode for said convolution signal, whereby surface acoustic wave of the convolution signal is extremely efficiently activated by said waveguides and propagates in a direction perpendicular to x-axis.

The surface acoustic wave of the convolution signal is very efficiently excited by the waveguides, if the distance of the waveguides 13S, 13L is so selected as to be approximately equal to $(m+\frac{1}{2})A$, wherein $A=v/(f+f')$, v is the velocity of the surface acoustic wave excited by the waveguides, f and f' are central frequencies of the input signals to the input comb-shaped electrodes 12-1, 12-2, respectively, and m is an integer.

Thus generated surface acoustic wave is converted into an electrical signal, by the output comb-shaped electrode 14 of which electrode fingers extend parallel to the longitudinal direction of the waveguides 13S, 13L, to thereby gain a convolution signal.

Figure 4:
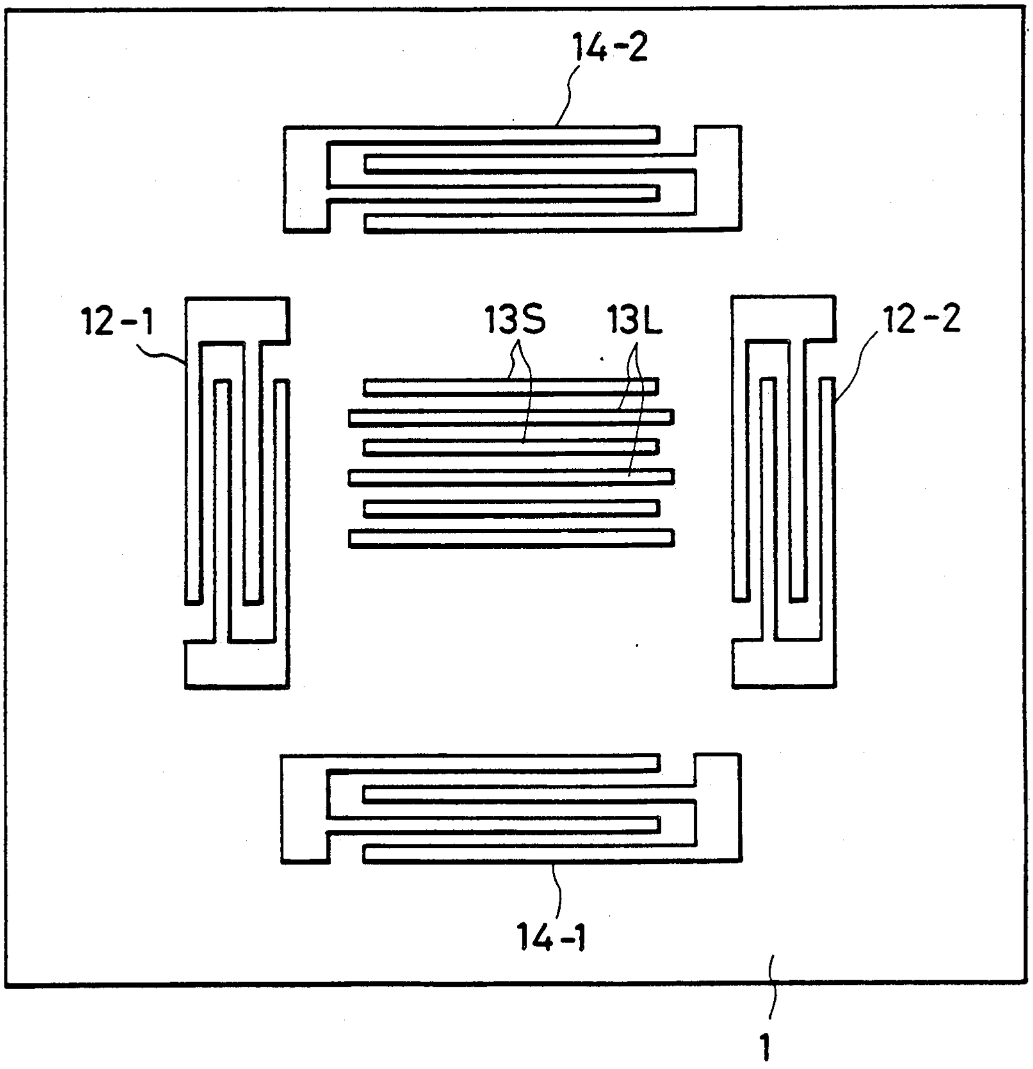
FIG. 4 is a schematic plan view of a variation of the first embodiment.

FIG. 4 is a schematic plan view of a variation of the foregoing first embodiment, wherein same components as those in FIG. 3 are represented by same numerals.

This embodiment differs from the foregoing first embodiment only in the point of the presence of output comb-shaped electrodes 14-1, 14-2 on both sides of the propagating direction of the surface acoustic waves in the wave guide paths 13S, 13L, and is capable of providing the convolution surface acoustic waves propagating to both sides of said wave guide paths.

The present variation not only has the same advantages as in the first embodiment, but is capable of providing a doubled output of said first embodiment, by synthesizing the outputs of the output comb-shaped electrodes 14-1, 14-2 inphase.

Also in the present embodiment there can be obtained convolution signals of different delay times by selecting the distance from the wave guide paths to the output electrode 14-1 different from that from the waveguides to the output electrode 14-2.

Figure 5:
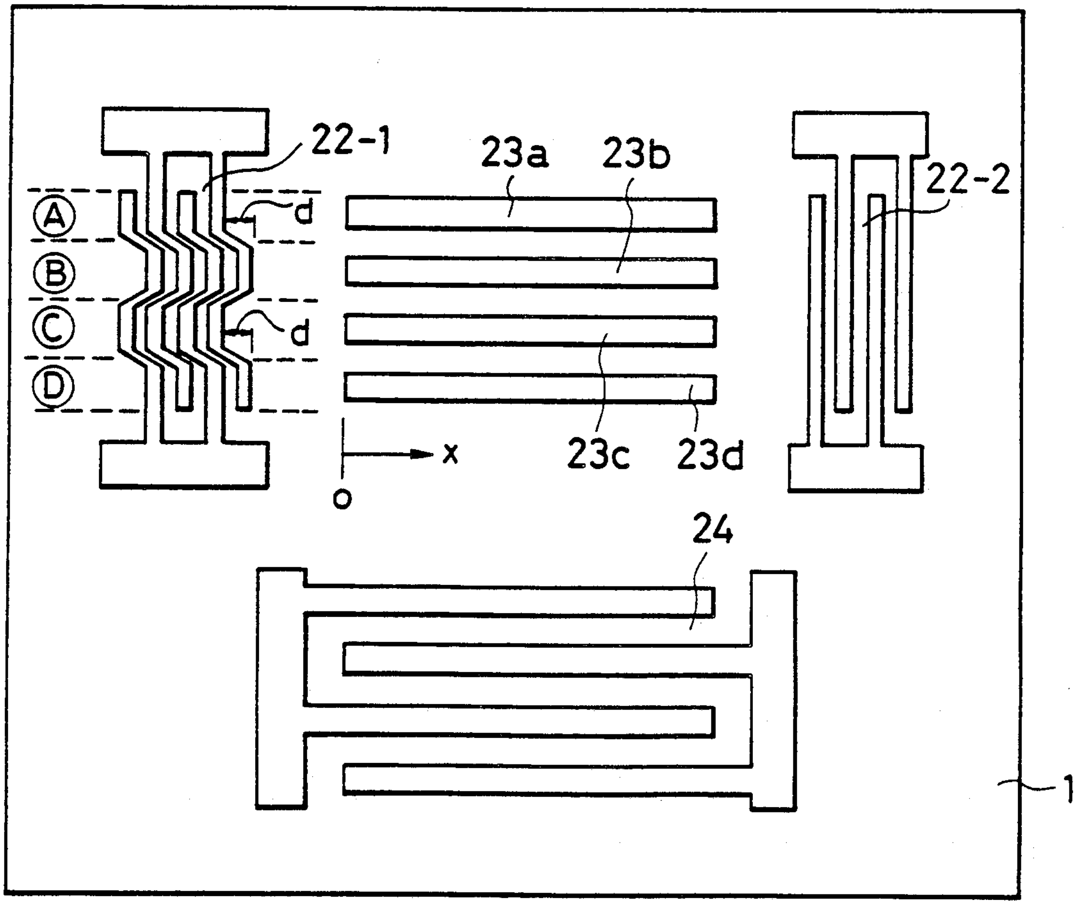
FIGS. 5 and 6 are schematic plan views showing second and third embodiments of the present invention.

FIG. 5 is a schematic plan view of a second embodiment of the surface acoustic wave convolver of the present invention.

On a piezoelectric substrate 1, there are provided input comb-shaped electrodes 22-1, 22-2 for generating surface acoustic waves, wave guide paths **23*a*, 23*b*, 23*c*, 23*d* for propagating said surface acoustic waves in mutually opposite directions, and an output comb-shaped electrode 24** for converting the surface acoustic waves excited by said waveguides into an electrical signal.

The input comb-shaped electrode 22-1 of the present embodiment is composed of four areas A–D crooked shape with alternately concave and convex form. A step between the areas A, C and areas B, D is set to $d=\lambda_1/2=v_1/2f_1$, wherein $\lambda_1$ is the wavelength of the surface acoustic wave generated by the input electrode, $v_1$ is the propagating velocity of the surface acoustic wave, and $f_1$ is the central frequency of the input signal. Waveguides **23*a*–23*d* are formed respectively corresponding to the four areas A–D of the input comb-shaped electrode 22-1 for transmitting the surface acoustic waves generated by the corresponding areas. For example the surface acoustic wave generated by the area A is transmitted by the path 23*a***.

In such structure, in response to a signal F(t)exp[Jωt] with a central angular frequency ω supplied to the input comb shaped electrode 22-1, a surface acoustic wave is excited and propagates in respective waveguide as explained in the following, wherein x axis is taken in the direction of propagation of said surface acoustic wave, with x=0 at the left end of path.

The surface acoustic waves Fa, Fc on the waveguides **23*a*, 23*c*** by the signal $F(t)e^{j\omega t}$ can be represented as $$Fa = Fc = F\left(t - \frac{x}{v_1}\right)e^{j\omega(t - \frac{x}{v_1})} \quad (6)$$

Also the surface acoustic waves Fb, Fd on the waveguides **23*b*, 23*d*** can be represented as:

$$Fb = Fd = F\left(t - \frac{x}{v_1} + \frac{1}{2f_1}\right)e^{j\omega(t - \frac{x}{v_1} + \frac{1}{2f_1})} \quad (7)$$

where $f_1=\omega/2\pi$.

Since F(t) varies sufficiently more slowly in comparison with the frequency $f_1$, there stands an approximation $F(t+\frac{1}{2}f_1)\simeq F(t)$, so that the equation (6) and (7) can be rewritten as:

$$Fb = Fd \simeq F\left(t - \frac{x}{v_1}\right)e^{j\omega(t - \frac{x}{v_1})+j\pi} = e^{j\pi}\cdot Fa \quad (8)$$

Thus the surface acoustic waves Fa, Fc on the paths **23*a*, 23*c* and those Fb, Fd on the paths 23*b*, 23*d*** are different in the phases from each other by 180°.

Consequently the surface acoustic waves Fa–Fd, upon reaching the other input comb-shaped electrode 22-2 through the waveguides **23*a*–23*d* are electrically neutralized on the electrode fingers of the comb-shaped electrode 22-2**, whereby the generation of the reflected wave by re-excitation is prevented.

Also in response to a signal $G(t)e^{j\omega t}$ with a central angular frequency ω supplied to the input comb-shaped electrode 22-2, there are generated surface acoustic waves Ga, Gb, Gc, Gd on the wave guide paths:

$$Ga = Gb = Gc = Gd = G\left(t - \frac{L-x}{v_1}\right)e^{j\omega(t - \frac{L-x}{v_1})} \quad (9)$$

of inphase, wherein L is the length of the wave guide paths in the x-direction.

However, upon reaching the other comb-shaped electrode 22-1, there appears a phase difference of 180° from each other for the surface acoustic waves between the areas A, C and B, D because of the aforementioned shift $d=\lambda_1/2=v_1/2f_1$ in distance of said areas on electrode fingers. Consequently the surface acoustic waves are electrically neutralized on the fingers of the comb-shaped electrode 22-1, so that the reflected wave due to re-excitation is not generated.

Such absence of reflected wave from the comb-shaped electrodes 22-1, 22-2 allows to suppress the self convolution that has been a problem in the conventional structure, and to improve the performance of the convolver.

The convolution operation will be explained as follows.

When two surface acoustic waves propagate in mutually opposite directions along each wave guide path 23, a product component from the surface acoustic waves is generated by the non-linear effect, thus providing a convolution signal. Convolution signals Ha, Hb, Hc, Hd on the wave guide paths can be represented as follows, from the equations (6)-(9):

$$Ha = Hc = \alpha \cdot e^{j2\omega t} \int_0^L F\left(t - \frac{x}{v_1}\right) \cdot G\left(t - \frac{L - x}{v_1}\right) dx \tag{10}$$

$$Hb = Hd = \alpha \cdot e^{j(2\omega t + \pi)} \int_0^L F\left(t - \frac{x}{v_1}\right) \cdot G\left(t - \frac{L - x}{v_1}\right) dx \tag{11}$$

Thus convolution signals which are different by 180° in phase are generated in the neighboring wave guide paths. Consequently a surface acoustic wave corresponding to said convolution signals is very efficiently generated from the waveguides by the piezoelectric effect, and propagates in the direction of arrangement of the wave guide paths. Said surface acoustic wave is converted into an electrical convolution signal, by the output comb-shaped electrode 24, of which fingers are arranged parallel to the longitudinal direction of the waveguides 23.

Thus a convolver of a high efficiency can be obtained by causing efficient propagation of the convolution signals generated on the wave guide paths, in the form of surface acoustic waves. As in the first embodiment, the pitch of the waveguides **23*a*-23*d*** is preferably selected as a multiple, by an odd number, of the half wavelength of the surface acoustic wave generated by the waveguides.

Figure 6:
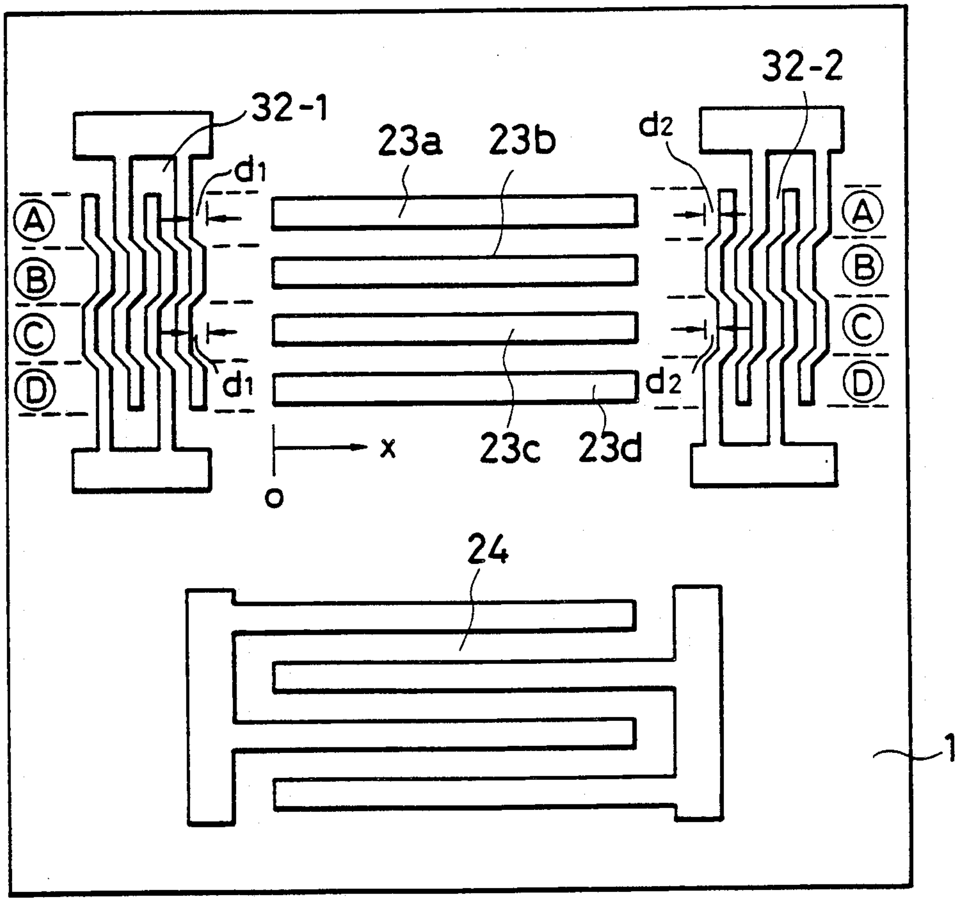

FIG. 6 is a schematic plan view of a third embodiment of the present invention.

In the present embodiment, the structure of the piezoelectric substrate 1, waveguides 23 and output comb-shaped electrode 24 is the same as that in the second embodiment. In the present embodiment, however, each of the input comb-shaped electrodes 32-1, 32-2 is divided into four areas A-D and is so shaped as to be crooked with alternately concave and convex form, and said areas and wave guide paths are arranged in mutually corresponding relationship in such a manner that, for example, the surface acoustic wave generated in the area A of an electrode 32-1 is propagated on the waveguide **23*a* and reaches the area A of the other electrode 32-2**.

The position of the fingers of the input comb-shaped electrode 32-1, 32-2 are shifted by distances $d_1$ and $d_2$ between neighboring areas: wherein $d_1+d_2$ is represented as follows.

$$d_1 + d_2 = \left(n + \frac{1}{2}\right)\lambda_1 = \left(n + \frac{1}{2}\right)\frac{v_1}{f_1} \tag{12}$$

wherein n is an integer.

When signals $F(t)e^{j\omega t}$ and $G(t)e^{j\omega t}$ of a central angular frequency $\omega$ are respectively supplied to the input electrodes 32-1 and 32-2 in the above-explained structure, surface acoustic waves propagate in the waveguide 23 corresponding to the respective area, as explained above.

However, between the areas A, C and B, D, there is a difference $d_1+d_2=(n+\frac{1}{2})\lambda 1$ in the length of the waveguide between two electrodes. Consequently, the surface acoustic waves excited in an electrode show a phase difference of 180° between the areas A, C and B, D upon reaching the other electrode, and are electrically neutralized on the fingers of the other electrode, thus preventing the generation of reflected wave by re-excitation. Thus the self convolution can be prevented.

On the other hand, the surface acoustic waves Fa, Ga on the wave guide path **23*a* can be represented by the aforementioned equations (6) and (9), and the surface acoustic waves Fc, Gc on the path 23*c*** can be similarly represented.

Also the surface acoustic waves Fb, Gb, Fd and Gd on the paths **23*b*, 23*d*** can be represented by $$Fb = Fd = F\left(t - \frac{x}{v_1} + \frac{d_1}{v_1}\right) e^{j\omega\left(t - \frac{x}{v_1} + \frac{d_1}{v_1}\right)} \simeq e^{j\omega\frac{d_1}{v_1}} \cdot Fa \tag{13}$$

$$Gb = Gd = G\left(t - \frac{L - x}{v_1} + \frac{d_2}{v_1}\right) e^{j\omega\left(t - \frac{L-x}{v_1} + \frac{d_2}{v_1}\right)} \simeq e^{j\omega\frac{d_2}{v}} \cdot Ga \tag{14}$$

On each wave guide paths there is generated a product signal of two surface acoustic signals, and following convolution signals Ha, Hb, Hc and Hd are generated:

$$\begin{aligned} Ha = Hc &= \alpha' \int_0^L Fa \cdot Ga\,dx \\ &= \alpha' \cdot e^{j2\omega t} \int_0^L F\left(t - \frac{x}{v_1}\right) G\left(t - \frac{L - x}{v_1}\right) dx \end{aligned} \tag{15}$$

$$\begin{aligned} Hb = Hd &= \alpha' \int_0^L Fb \cdot Gb\,dx \\ &= \alpha' \cdot e^{j\omega\frac{d_1+d_2}{v_1}} \int_0^L Fa\,Ga\,dx \end{aligned} \tag{16}$$

By substituting the equation (16) with (12):

$$Hb = Hd = \alpha' \cdot e^{j\pi} \int_0^L Fa\,Ga\,dx = e^{j\pi}Ha = e^{j\pi}Hc \tag{17}$$

Thus convolution signals with a phase difference of 180° from each other are generated in the neighboring waveguides so that a high efficiency can be attained as in the second embodiment.

Figure 7:
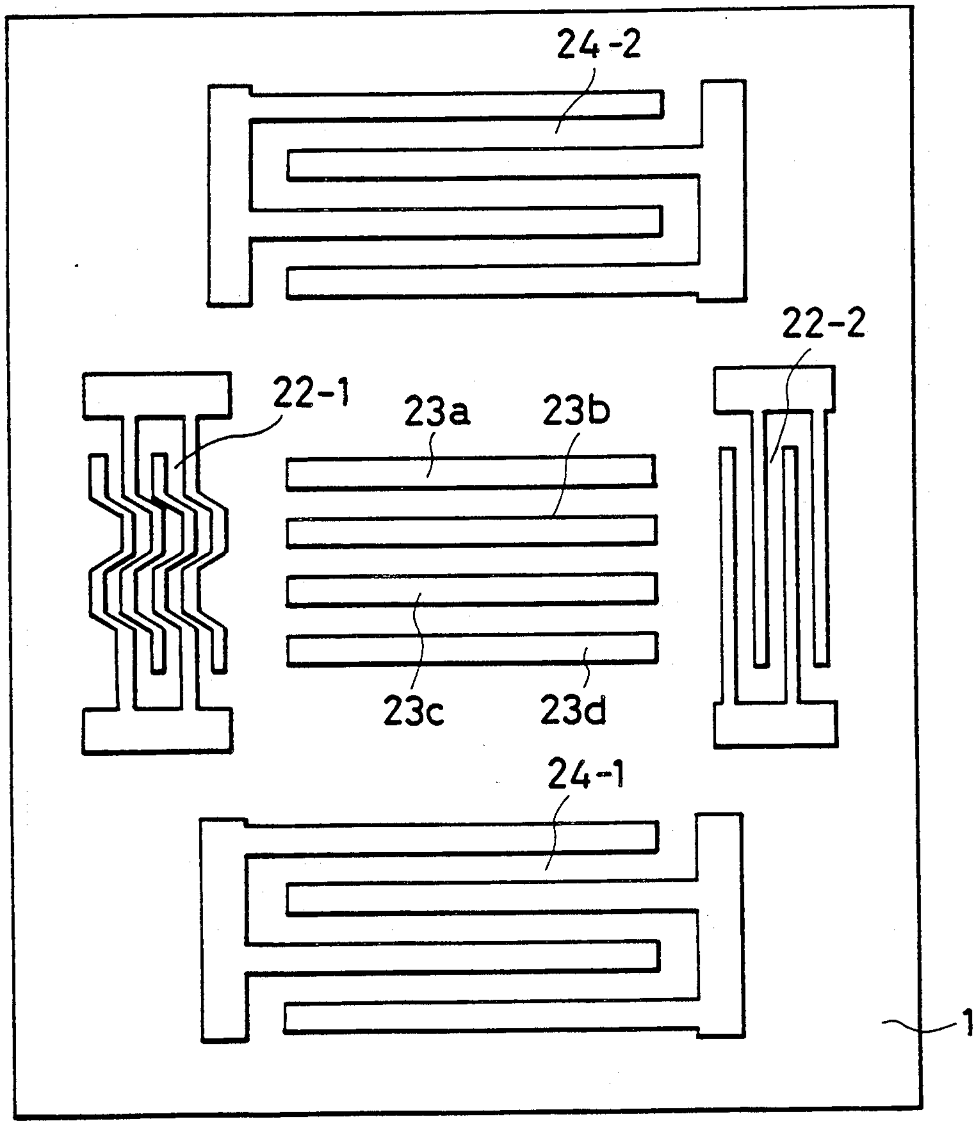
FIG. 7 is a schematic plan view of a variation of the second embodiment.

FIG. 7 is a schematic plan view of a variation of the aforementioned second embodiment.

The input comb-shaped electrodes 22-1, 22-2, and the waveguides **23*a*-23*d* formed on the piezoelectric substrate 1 are the same as those in the second embodiment, but, in the present variation, there are provided output comb-shaped electrodes 24-1, 24-2 on both sides of the propagating direction of the surface acoustic waves of the waveguides 23*a*-23*d***.

There can therefore be obtained a doubled output, in comparison with the second embodiment, by synthesizing the outputs of the electrodes 24-1 and 24-2 in the same phase.

Also there can be obtained two convolution signals of different delay times, by placing the output electrodes 24-1 and 24-2 at different distances from the wave guide paths *23a–23d*.

In the present variation, the input comb-shaped electrodes are shaped the same as those in the second embodiment, but a similar effect can also be obtained by adopting the same shape as in the third embodiment.

In the foregoing embodiments there have been employed four wave guide paths *23a–23d*, but said number is naturally not limitative. It is possible to modify the frequency characteristics of the surface acoustic wave propagating from the waveguides, as in the ordinary comb-shaped electrodes, by varying the number, width and pitch of the wave guide paths.

Figure 8:
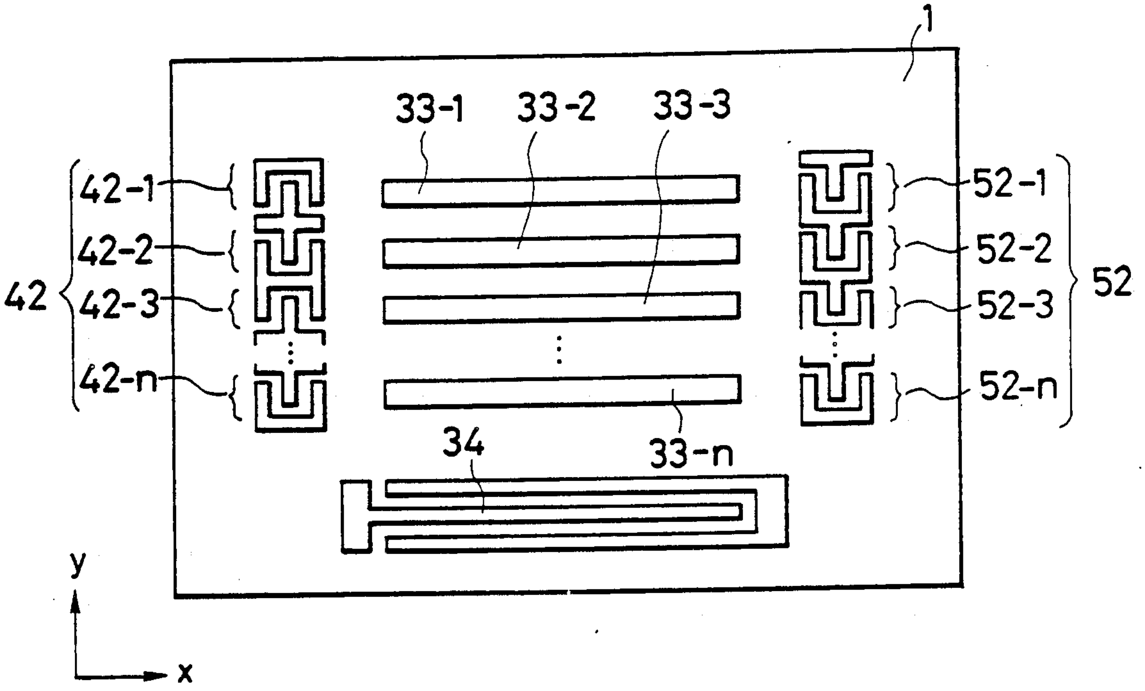
FIGS. 8 and 9 are schematic plan views of fourth and fifth embodiments of the present invention.

FIG. 8 is a schematic plan view of a fourth embodiment of the surface acoustic wave convolver of the present invention.

In FIG. 8, a piezoelectric substrate 1 can be composed of an already known material, such as lithium niobate. A pair of surface acoustic wave exciting electrodes (input comb-shaped electrodes) 42, 52 are formed in mutually opposed relationship, with a suitable distance therebetween in the x-direction on said substrate 1. Each of said comb-shaped electrodes 42, 52 is composed of n elements 42-1–42-n and 52-1 52-n arranged with a pitch p in the y-direction An electrode 42 is so constructed that the voltage is applied inphase to the neighboring electrode elements, while the other electrode 52 is so constructed that the voltage is supplied in opposite phases to the neighboring electrode elements. Said electrodes are composed of a conductive material such as aluminum, with electrode fingers so as that the surface acoustic wave propagates in the x-direction.

Waveguides 33-1, 33-2, . . . , 33-n are provided in parallel manner with a pitch P, on the substrate 1, in the x-direction between the electrodes 42 and 52. As shown in FIG. 8, the wave guide paths 33-1–33-n are provided, respectively corresponding to the electrode elements 42-1–42-n and 52-1–52-n. Said wave guide paths are formed by depositing a conductive material such as aluminum. An acoustoelectric converter 34, constituting a comb-shaped output electrode, is suitably separated in the y-direction from the above-mentioned wave guide paths, and is composed of a conductive material such as aluminum, for efficiently converting the surface acoustic wave propagating in the y-direction into an electrical signal by the electrode fingers.

When an electrical signal F(t)exp(jωt) with a central angular frequency ω is applied to an input comb-shaped electrode 42 of the surface acoustic wave convolver of the present embodiment, surface acoustic waves of said frequency with a same phase are excited from the electrode elements. The surface acoustic waves propagate respectively in the wave guide paths 33-1–33-n positively in the x-direction to reach the other input comb-shaped electrode 52 with same phases. On the other hand, when an electrical signal G(t)exp(jωt) of a central angular frequency ω is applied to the other input comb-shaped electrode 52, the electrode elements excitedly generate surface acoustic waves of said frequency in such a manner that the phase is inverted between the neighboring electrode elements. Said surface acoustic waves propagate in the waveguides 33-1–33-n in the negative x-direction and reach the input comb-shaped electrode 42 with the inverted phases between the neighboring electrode elements. As the surface acoustic waves transmitted from the electrode 42 to the electrode 52 are of a same phase among the electrode elements thereof and are output from the electrode 52 with inverted phase between the neighboring electrode elements, (i.e. the polarity is inverted), so that said surface acoustic waves reached at the electrode are electrically neutralized, and as a result, the reflected wave by the re-excitation is not generated. On the other hand, the surface acoustic waves transmitted from the electrode 52 to the electrode 42 are inverted between the neighboring electrodes and are output from the electrode 42 with a same phase from all the elements thereof, (i.e. the polarity is same) so that the surface acoustic waves reached at said electrode 42 are electrically neutralized and as a result, the reflected wave by re-excitation is not generated. Thus the present embodiment can suppress the self convolution, which is encountered in the conventional surface acoustic wave convolver by the superposition of a surface acoustic wave propagating in a first direction in the waveguide, excited from one of the input comb-shaped electrodes 42, 52 to the other and a wave reflected by the other of said electrode and propagating in a second direction in said waveguide.

In the wave guide paths 33-1–33-n, there are generated convolution signals of the signals F(t)ext(jωt) and G(t)exp(jωt) entered to the input comb-shaped electrode 42, 52, but the signal G(t)exp(jωt) is inverted in phase between the neighboring wave guide paths. Thus, when a convolution signal Ha generated in the odd waveguides 33-1, 33-3, 33-5, . . . is represented by:

$$Ha = \alpha \exp(j2\omega t) \int_0^L F(t - x/v_1)G(t - (L - x)/v_1)dx$$

wherein L is the length of the wave guide path, a convolution signal Hb generated in the even waveguides 33-2, 33 4, 33-6, . . . is represented by:

$$Hb = -\alpha \exp(j2\omega t) \int_0^L F(t - x/v_1)G(t - (L - x)/v_1)dx$$

Thus the convolutions signals of mutually opposite phases are generated in the mutually neighboring wave guide, and surface acoustic waves corresponding to these signals are efficiently excitedly generated from the wave guide paths by the piezoelectric effect and propagate in the y-direction. These surface acoustic waves are converted into an electrical signal to be output at the output comb-shaped electrode 24.

In the present embodiment, the arrangement pitch p of the elements of the input comb-shaped electrodes 42, 52 and the arrangement pitch P of the wave guide paths 33-1–33-n are selected as a multiple by an odd number of about a half of the wavelength λ of the surface acoustic wave corresponding to said convolution signals, whereby said surface acoustic waves corresponding to the convolution signals are superposed with substantially the same phase, so that the surface acoustic waves can be most efficiently transmitted and efficiently output by the output comb-shaped electrode 24.

Figure 9:
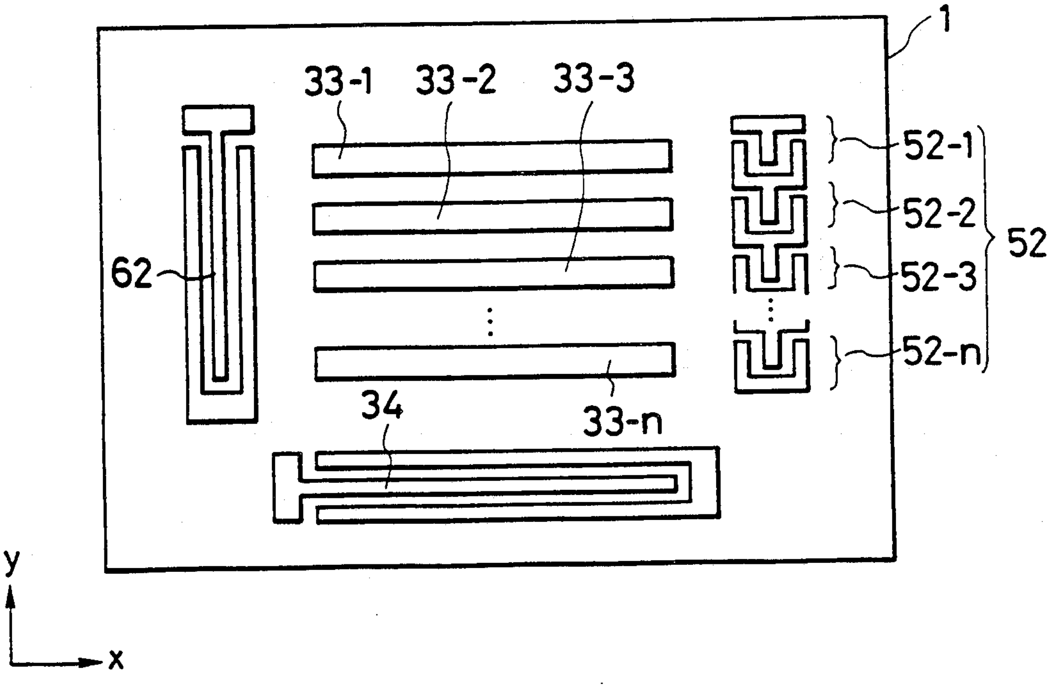

FIG. 9 is a schematic plan view of fifth embodiment of the surface acoustic wave convolver of the present invention, wherein same components as those in FIG. 8 are represented by the same numeral.

The present embodiment is different from the foregoing fourth embodiment in that the input comb-shaped electrode 62 is not composed of plural electrode elements but of a single comb-shaped electrode.

The present embodiment also provides the same effect as in the first embodiment.

Figure 10:
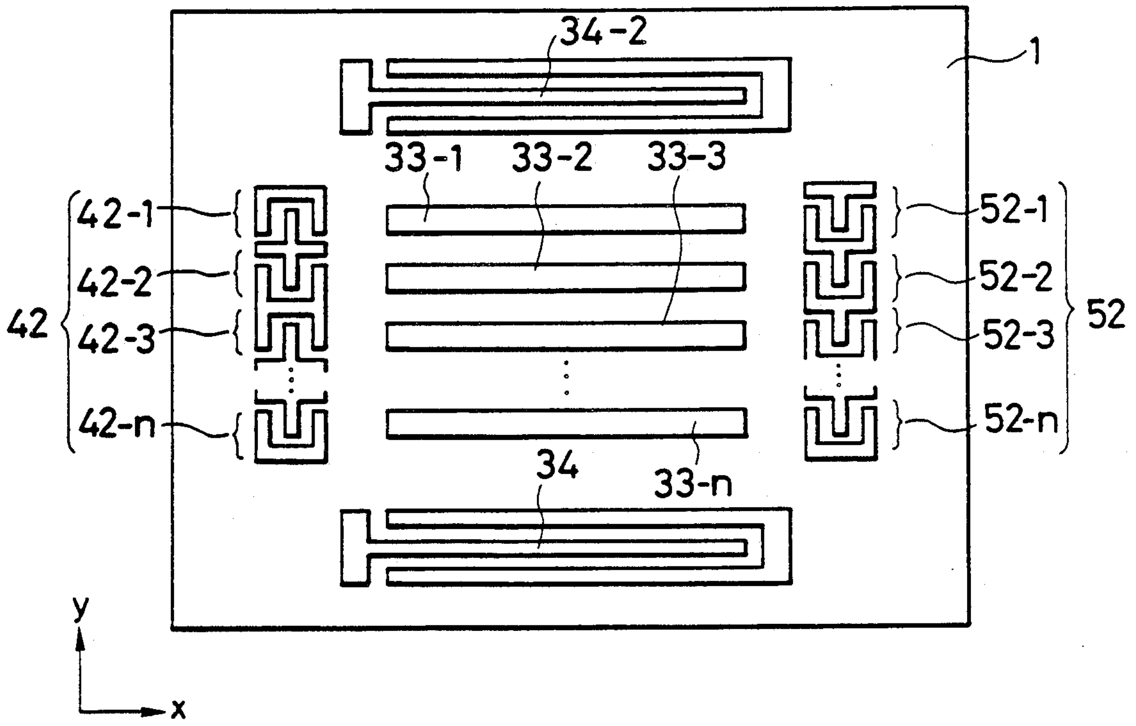
FIG. 10 is a schematic plan view of a variation of the fourth embodiment.

FIG. 10 is a schematic plan view of a sixth embodiment, wherein the same components as those in FIG. 8 are represented by the same numeral.

The present embodiment is different from the foregoing fourth embodiment in that an additional output comb-shaped electrode 34-2, same as the output electrode 34, is provided on the substrate 1, is provided in the y-direction at the same distance but opposite to the electrode 34.

The present embodiment provides the same effect as in said fourth embodiment but can provide a doubled output in comparison with said fourth embodiment by synthesizing the outputs of the electrodes 34, 34-2, since the surface acoustic wave of the convolution signals generated by the wave guide paths propagates in both directions along the y-axis. It is also possible to generate a suitable delay between the outputs of the output comb-shaped electrodes 34, 34-2 by placing said electrodes at different distances from the waveguides.

In the present embodiment the input comb-shaped electrode 42 is shaped the same as in the fourth embodiment, but it may also be shaped the same as in the fifth embodiment.

The present invention is applicable in various applications, in addition to the foregoing embodiments. For example, the foregoing embodiments employ ordinary single electrode as the input comb-shaped electrode, but the self convolution can be further suppressed by the use of double (split) electrode.

Similarly such double electrode may be employed as the output comb shaped electrode for suppressing the generation of a reflected wave at said electrode, thereby improving the performance of the convolver.

Also in the foregoing embodiments, the beam width of the surface acoustic wave generated by the input comb-shaped electrode is selected substantially equal to the width of all the wave guide paths, so that the surface acoustic wave excited by the input comb-shaped electrode is directly guided to the wave guide paths. In the present invention, however, it is also possible to generate the surface acoustic wave with a relatively wide comb-shaped electrode and to reduce the beam width by a beam width converter such as horn-type wave guide path or a multi-strip coupler or the like to the width of all the wave guide paths. It is furthermore possible to generate a converging surface acoustic wave by an arc shaped comb shaped electrode and to guide said wave to the wave guide path after having reduced the width of said wave to the width of said waveguides.

The present invention includes all these applications within the scope of the appended claims.

What is claimed is:

1. A surface acoustic wave convolver, comprising:

a piezoelectric substrate;

a plurality of input transducers formed on said substrate and adapted to respectively generate surface acoustic waves in response to input signals;

a plurality of waveguides provided in parallel on said substrate in a superposing area of the surface acoustic waves generated by said input transducers to each generate a convolution signal of the input signals by non-linear interaction of the surface acoustic waves therein, wherein the convolution signals generated in neighboring wave guide paths are mutually different by 180° in phase, and wherein said waveguides are adapted to generate surface acoustic waves corresponding to the convolution signals; and an output transducer for receiving the surface acoustic waves generated by said waveguides, thereby converting the convolution signals into an output electrical signal.

2. A surface acoustic wave convolver according to claim 1, wherein the pitch of arrangement of said waveguides is a multiple by an odd number of a half of the wavelength of the surface acoustic wave generated by said waveguides.

3. A surface acoustic wave convolver according to claim 1, wherein the neighboring waveguides have mutually different lengths in the propagating direction of the surface acoustic waves from said input transducers.

4. A surface acoustic wave convolver according to claim 3, wherein the difference ΔL in length of the neighboring waveguides satisfies the following condition:

$$\Delta L\left(\frac{1}{v_m} - \frac{1}{v_0}\right) = \frac{1}{f}\left(n + \frac{1}{2}\right)$$

wherein $v_m$ is the velocity of the surface acoustic wave in said waveguides; $v_0$ is the velocity of the surface acoustic wave on said substrate surface not provided with said waveguide; f is the central frequency of the input signal; and n is an integer.

5. A surface acoustic wave convolver according to claim 1, wherein at least one of said input transducers is divided into a plurality of portions corresponding to said waveguides, and the sum of the distances from said input transducers to said wave guide path is different between said neighboring waveguides.

6. A surface acoustic wave convolver according to claim 5, wherein the difference d in the sum of distances from said input transducers to said waveguide between said neighboring waveguides satisfies the following condition:

$$d = \frac{v}{f}\left(n + \frac{1}{2}\right)$$

wherein v is the propagating velocity of the surface acoustic wave; f is the central frequency of the input signal; and n is an integer.

7. A surface acoustic wave convolver according to claim 1, wherein said input transducer is composed of a comb-shaped electrode.

8. A surface acoustic wave convolver according to claim 7, wherein one of said input transducers is divided into a plurality of portions corresponding to said wave guide paths, and has such electrode structure that a voltage is applied in inverted phases in mutually neighboring portions.

9. A surface acoustic wave convolver according to claim 1, wherein said waveguides are adapted to generate surface acoustic waves to both sides of the direction of arrangement thereof, and said output transducer is composed of two output transducers for receiving said surface acoustic waves.

10. A surface acoustic wave convolver according to claim 1, wherein said output transducer is composed of a comb-shaped electrode.

11. A surface acoustic wave convolver according to claim 1, wherein said waveguide is composed of a conductive film formed on said substrate.

12. A surface acoustic wave convolver according to claim 1, wherein said substrate is composed of lithium niobate.

* * * * *

UNITED STATES PATENT AND TRADEMARK OFFICE

CERTIFICATE OF CORRECTION

PATENT NO. : 5,003,213 Page 1 of 7

DATED : March 26, 1991

INVENTOR(S) : MOCHIZUKI, ET AL.

It is certified that error appears in the above-identified patent and that said Letters Patent is hereby corrected as shown below:

ON THE TITLE PAGE:

AT [19]

"Mochuzuki et al." should read --Mochizuki et al.--;

AT [30] Foreign Application Priority Data:

"Feb. 20, 1989 [JP] . . . . . . . . 1-030394" should read
--Feb. 20, 1989 [JP] Japan . . . . 1-038394--;

AT [75] INVENTORS

"Norihiro Mochuzuki, Yokohama;" should read
--Norihiro Mochizuki, Yokohama;--.

COLUMN 1

Line 47, "$H(t) = \alpha \cdot \exp(j2\omega t) {}_{O}^{L} F(t - x/v)G(t - (L - x)/v)dx^{(2)}$"

should read $$--H(t) = \alpha \cdot \exp(j2\omega t) \int_{O}^{L} F(t - x/v)G(t - (L - x)/v)dx^{(2)}--.$$

COLUMN 2

Line 4, "wave guide paths 3-1-3-N," should read --waveguides 3-1-3-N,--.
Line 9, "wave guide paths 3-1-3-N," should read --waveguides 3-1-3-N--.

UNITED STATES PATENT AND TRADEMARK OFFICE

CERTIFICATE OF CORRECTION

PATENT NO. : 5,003,213

DATED : March 26, 1991

INVENTOR(S) : MOCHIZUKI, ET AL.

It is certified that error appears in the above-identified patent and that said Letters Patent is hereby corrected as shown below:

COLUMN 3

Line 49, "wave guide paths 13S, 13L," should read --waveguides 13S, 13L,--.

Line 51, "wave guide paths 13S, 13L," should read --waveguides 13S, 13L,--.

Line 59, "wave guide paths" should read --waveguides--.

COLUMN 4

Line 12, "wave guide path 13S" should read --waveguide 13S--.

Line 38, "$H_s(t) = \alpha \cdot \exp(j2\omega t) {}_{O}^{L} F(t - x/v_m)G(t - (L - x)/v_m)dx$"

should read

--$H_s(t) = \alpha \cdot \exp(j2\omega t) \int_{O}^{L} F(t - x/v_m)G(t - (L - x)/v_m)dx$--.

Line 45, "$\exp \Big[ j(2\omega t - \Delta t_1 - \Delta t_2) {}_{-L_1}^{L + L_2} F(t - x/v_m - \Delta t_1) \cdot$"

should read

--$\exp \Big[ j(2\omega t - \Delta t_1 - \Delta t_2) \int_{-L_1}^{L + L_2} F(t - x/v_m - \Delta t_1) \cdot$--.

UNITED STATES PATENT AND TRADEMARK OFFICE
CERTIFICATE OF CORRECTION

PATENT NO. : 5,003,213 Page 3 of 7

DATED : March 26, 1991

INVENTOR(S) : MOCHIZUKI, ET AL.

It is certified that error appears in the above-identified patent and that said Letters Patent is hereby corrected as shown below:

COLUMN 4

Line 62, "$\exp[j(2\omega t - \pi)] \; {}_{-L_1}^{L + L_2} \; F(t - x/v_m)G(t - (L - x)/v_m)dx$"

should read

--$\exp[j(2\omega t - \pi)] \int_{-L_1}^{L + L_2} F(t - x/v_m)G(t - (L - x)/v_m)dx$--.

COLUMN 5

Line 30, "wave guide paths." should read --waveguides.--.
Line 38, "wave guide paths" should read --waveguides--.

COLUMN 6

Line 41, "wave guide paths:" should read --waveguides:--.

COLUMN 7

Lines 5-7,

"$Ha = Hc = \alpha \cdot e^{j2\omega t} \; {}_{0}^{L} \; F\left[t - \frac{x}{v_1}\right] \cdot G\left[t - \frac{L - x}{v_1}\right] dx \qquad (10)$"

should read

--$Ha = Hc = \alpha \cdot e^{j2\omega t} \int_{0}^{L} F\left[t - \frac{x}{v_1}\right] \cdot G\left[t - \frac{L - x}{v_1}\right] dx \qquad (10)$--

UNITED STATES PATENT AND TRADEMARK OFFICE
CERTIFICATE OF CORRECTION

PATENT NO. : 5,003,213 Page 4 of 7

DATED : March 26, 1991

INVENTOR(S) : MOCHIZUKI, ET AL.

It is certified that error appears in the above-identified patent and that said Letters Patent is hereby corrected as shown below:

COLUMN 7

Lines 8-10,

"$Hb = Hd = \alpha \cdot e^{j(2\omega t + \pi)} {}_{O}^{L} F \left[ t - \frac{x}{v_1} \right] .$ (11)"

should read

--$Hb = Hd = \alpha \cdot e^{j(2\omega t + \pi)} \int_{O}^{L} F \left[ t - \frac{x}{v_1} \right] .$ (11)--"

COLUMN 8

Lines 34-35,

"$Ha = Hc = \alpha' {}_{O}^{L} Fa \cdot Ga \, dx$ (15)" should read

--$Ha = Hc = \alpha' \int_{O}^{L} Fa \cdot Ga \, dx$ (15)--

Lines 36-37,

"$= \alpha' \cdot e^{j2\omega t} {}_{O}^{L} F \left[ t - \frac{x}{v_1} \right] G \left[ t - \frac{L - x}{v_1} \right] dx$"

should read

--$= \alpha' \cdot e^{j2\omega t} \int_{O}^{L} F \left[ t - \frac{x}{v_1} \right] G \left[ t - \frac{L - x}{v_1} \right] dx$--

UNITED STATES PATENT AND TRADEMARK OFFICE

CERTIFICATE OF CORRECTION

PATENT NO. : 5,003,213 Page 5 of 7

DATED : March 26, 1991

INVENTOR(S) : MOCHIZUKI, ET AL.

It is certified that error appears in the above-identified patent and that said Letters Patent is hereby corrected as shown below:

COLUMN 8

Lines 40-41,

"$Hb = Hd = \alpha' \quad {}_{O}^{L} \quad Fb \cdot Gb\, dx \qquad (16)$"

should read

--$Hb = Hd = \alpha' \int_{O}^{L} Fb \cdot Gb\, dx \qquad (16)$--"

Lines 43-44,

"$= \alpha' \cdot e^{j\omega \frac{d_1 + d_2}{v_1}} \quad {}_{O}^{L} Fa\ Ga\ dx$"

should read

--$= \alpha' \cdot e^{j\omega \frac{d_1 + d_2}{v_1}} \int_{O}^{L} Fa\ Ga\ dx$--

Lines 49-50,

"$Hb = Hd = \alpha' e^{j\pi} \quad {}_{O}^{L} \quad Fa\ Ga\ dx = e^{j\pi} Ha = e^{j\pi} Hc \qquad (17)$"

should read

--$Hb = Hd = \alpha' e^{j\pi} \int_{O}^{L} Fa\ Ga\ dx = e^{j\pi} Ha = e^{j\pi} Hc \qquad (17)$--"

UNITED STATES PATENT AND TRADEMARK OFFICE

CERTIFICATE OF CORRECTION

PATENT NO. : 5,003,213

DATED : March 26, 1991

INVENTOR(S) : MOCHIZUKI, ET AL.

It is certified that error appears in the above-identified patent and that said Letters Patent is hereby corrected as shown below:

COLUMN 10

Lines 32-33,

"$Ha = \alpha \exp(j2\omega t) \; {}_{O}^{L} \; F(t - x/v_1)G(t - (L - x)/v_1)dx$"

should read

--$Ha = \alpha \exp(j2\omega t) \int_{O}^{L} F(t - x/v_1)G(t - (L - x)/v_1)dx$--

Lines 40-41,

"$Hb = -\alpha \exp(j2\omega t) \; {}_{O}^{L} \; F(t - x/v_1)G(t - (L - x)/v_1)dx$"

should read

--$Hb = -\alpha \exp(j2\omega t) \int_{O}^{L} F(t - x/v_1)G(t - (L - x)/v_1)dx$--

UNITED STATES PATENT AND TRADEMARK OFFICE
CERTIFICATE OF CORRECTION

PATENT NO. : 5,003,213 Page _7_ of _7_

DATED : March 26, 1991

INVENTOR(S) : MOCHIZUKI, ET AL.

It is certified that error appears in the above-identified patent and that said Letters Patent is hereby corrected as shown below:

COLUMN 10

Line 44, "wave" should read --waveguides,--.
Line 45, "guide," should be deleted.

COLUMN 11

Line 4, "first" should read --fourth--.

Signed and Sealed this

Tenth Day of December, 1991

*Attest:*

HARRY F. MANBECK, JR.

*Attesting Officer* *Commissioner of Patents and Trademarks*